US007981779B2

(12) United States Patent
Sasaki et al.

(10) Patent No.: US 7,981,779 B2
(45) Date of Patent: Jul. 19, 2011

(54) METHOD FOR MAKING JUNCTION AND PROCESSED MATERIAL FORMED USING THE SAME

(75) Inventors: Yuichiro Sasaki, Tokyo (JP); Cheng-Guo Jin, Kanagawa (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 263 days.

(21) Appl. No.: 10/574,863

(22) PCT Filed: Oct. 8, 2004

(86) PCT No.: PCT/JP2004/015308
§ 371 (c)(1),
(2), (4) Date: Apr. 6, 2006

(87) PCT Pub. No.: WO2005/036626
PCT Pub. Date: Apr. 21, 2005

(65) Prior Publication Data
US 2007/0042578 A1 Feb. 22, 2007

(30) Foreign Application Priority Data
Oct. 9, 2003 (JP) ................................. 2003-350368

(51) Int. Cl.
*H01L 21/223* (2006.01)
(52) U.S. Cl. .................. 438/513; 438/798; 257/E21.143
(58) Field of Classification Search .................. 438/513, 438/520, 532, FOR. 161, FOR. 155, 798; 257/E21.143
See application file for complete search history.

(56) References Cited

U.S. PATENT DOCUMENTS

| 5,407,845 | A |   | 4/1995  | Nasu et al.          |
|-----------|---|---|---------|----------------------|
| 5,496,752 | A |   | 3/1996  | Nasu et al.          |
| 5,561,072 | A |   | 10/1996 | Saito                |
| 5,892,235 | A |   | 4/1999  | Yamazaki et al.      |
| 5,897,346 | A |   | 4/1999  | Yamaguchi et al.     |
| 5,915,196 | A |   | 6/1999  | Mineji               |
| 5,956,581 | A |   | 9/1999  | Yamazaki et al.      |
| 5,969,398 | A | * | 10/1999 | Murakami ..... 257/412 |
| 6,013,332 | A |   | 1/2000  | Goto et al.          |
| 6,025,252 | A | * | 2/2000  | Shindo et al. ..... 438/509 |
| 6,030,863 | A | * | 2/2000  | Chang et al. ..... 438/229 |

(Continued)

FOREIGN PATENT DOCUMENTS

CN 1388591 1/2003

(Continued)

OTHER PUBLICATIONS

Talwar et al., "Study of Laser Thermal Processing (LPT) to Meet Sub 130 nm Node Shallow Junction Requirements", 2000, pp. 175-177.

(Continued)

*Primary Examiner* — George Fourson
(74) *Attorney, Agent, or Firm* — McDermott Will & Emery LLP

(57) ABSTRACT

An object of this invention is to provide a method for making a junction which is simple in the process, high in the throughput, and can make a shallow junction with high accuracy. After the suitable state of a substrate surface adapted to the wavelength of an electromagnetic wave to be applied has been formed, the electromagnetic wave is applied to electrically activate impurities so that the excited energy is effectively absorbed within the impurity thin film, thereby effectively making a shallow junction.

17 Claims, 4 Drawing Sheets

U.S. PATENT DOCUMENTS

| | | | |
|---|---|---|---|
| 6,037,204 A * | 3/2000 | Chang et al. | 438/231 |
| 6,051,482 A | 4/2000 | Yang | |
| 6,153,524 A | 11/2000 | Henley et al. | |
| 6,159,810 A * | 12/2000 | Yang | 438/301 |
| 6,218,249 B1 * | 4/2001 | Maa et al. | 438/300 |
| 6,265,321 B1 | 7/2001 | Chooi et al. | |
| 6,465,727 B2 | 10/2002 | Maruyama et al. | |
| 6,475,840 B1 * | 11/2002 | Miyanaga et al. | 438/166 |
| 6,583,018 B1 | 6/2003 | Matsunaga et al. | |
| 6,653,699 B1 | 11/2003 | Yang | |
| 6,713,819 B1 | 3/2004 | En et al. | |
| 6,893,907 B2 * | 5/2005 | Maydan et al. | 438/149 |
| 7,192,854 B2 | 3/2007 | Sasaki et al. | |
| 7,348,264 B2 | 3/2008 | Sasaki et al. | |
| 7,358,511 B2 | 4/2008 | Sasaki et al. | |
| 7,407,874 B2 | 8/2008 | Sasaki et al. | |
| 7,456,085 B2 | 11/2008 | Sasaki et al. | |
| 7,759,254 B2 * | 7/2010 | Sasaki et al. | 438/717 |
| 2001/0015262 A1 | 8/2001 | Denpoh | |
| 2001/0025999 A1 * | 10/2001 | Suguro | 257/410 |
| 2001/0039107 A1 * | 11/2001 | Suguro | 438/585 |
| 2001/0048115 A1 * | 12/2001 | Yamazaki et al. | 257/154 |
| 2002/0006689 A1 | 1/2002 | Miyasaka | |
| 2002/0070382 A1 * | 6/2002 | Yamazaki et al. | 257/72 |
| 2002/0111000 A1 | 8/2002 | Kawakami et al. | |
| 2002/0112951 A1 | 8/2002 | Fan | |
| 2003/0027393 A1 * | 2/2003 | Suguro | 438/287 |
| 2003/0030108 A1 | 2/2003 | Morosawa | |
| 2003/0107036 A1 * | 6/2003 | Yamazaki et al. | 257/57 |
| 2003/0193066 A1 | 10/2003 | Ito et al. | |
| 2003/0211670 A1 * | 11/2003 | Downey | 438/197 |
| 2003/0211713 A1 * | 11/2003 | Suguro et al. | 438/481 |
| 2004/0102017 A1 * | 5/2004 | Chang et al. | 438/424 |
| 2004/0166612 A1 * | 8/2004 | Maydan et al. | 438/149 |
| 2004/0235281 A1 * | 11/2004 | Downey et al. | 438/530 |
| 2004/0241967 A1 * | 12/2004 | Yamazaki et al. | 438/487 |
| 2005/0196961 A1 * | 9/2005 | Zhang et al. | 438/655 |
| 2005/0227463 A1 | 10/2005 | Ito et al. | |
| 2006/0205192 A1 | 9/2006 | Walther et al. | |
| 2006/0264051 A1 * | 11/2006 | Thibaut | 438/690 |
| 2008/0226272 A1 * | 9/2008 | Kasai et al. | 392/418 |
| 2010/0006776 A1 | 1/2010 | Tanabe et al. | |

FOREIGN PATENT DOCUMENTS

| | | |
|---|---|---|
| EP | 1 648 023 A1 | 4/2006 |
| JP | 58-97863 | 6/1983 |
| JP | 03-218638 | 9/1991 |
| JP | 5-206045 | 8/1993 |
| JP | 6-89904 | 3/1994 |
| JP | 6-310533 | 11/1994 |
| JP | 7-142421 | 6/1995 |
| JP | 2530990 B2 | 9/1996 |
| JP | 8-279475 | 10/1996 |
| JP | 9-17867 | 1/1997 |
| JP | 9-199719 | 7/1997 |
| JP | 10-163123 | 6/1998 |
| JP | 2000-12481 | 1/2000 |
| JP | 2003-7636 | 1/2003 |
| JP | 2003-86629 | 3/2003 |
| JP | 2004-14878 | 1/2004 |
| JP | 2004-158627 | 6/2004 |
| TW | 484187 | 4/2002 |
| TW | 489396 | 6/2002 |
| TW | 504845 | 10/2002 |
| WO | WO 98/34268 | 8/1998 |
| WO | WO 01/71787 A1 | 9/2001 |
| WO | WO 03/014979 A | 2/2003 |

OTHER PUBLICATIONS

Ito et al., "Flash Lamp Annealing Technology for Ultra-shallow Junction Formation", Extended Abstract of International Workshop on Junction Technoloy, 2002, pp. 23-26.

Yamamoto et al., "Impact of Pre-Amorphization for the Reduction of Contact Resistance Using Laser Thermal Process", Extended Abstract of International Workshop on Junction Technoloy, 2002, pp. 27-30.

Kagawa et al., Influence of Pulse Duration on KrF Excimer Laser Annealing Process for Ultra Shallow Junction Formation, Extended Abstract of International Workshop on Junction Technoloy, 2002, pp. 31-34.

Ito et al., "Improvement of Threshold Voltage Roll-off by Ultra-shallow Junction Formed by Flash Lamp Annealing", 2003, pp. 53-543.

European Supplementary Search Report, with Written Opinion, issued in European Patent Application No. EP 04773759.8/1672683 dated on Sep. 2, 2008.

Ito et al "10-15nm Ultrashallow Junction Formation byFlash-Lamp Annealing" pp. 2394-2398 Japanese Journal of Applied Physics, Tokyo, Japan vol. 41, No. 4b Sep. 26, 2001.

United States Notice of Allowance issued in U.S. Appl. No. 12/007,736 dated Nov. 18, 2009.

Taiwanese Office Action issued in Taiwanese Patent Application No. 093103328 dated Dec. 16, 2009.

International Search Report corresponding to application No. PCT/JP2004/001473 dated Apr. 13, 2004.

D. Lenoble et al., "Reliable and enhanced performances of sub-0.1 μm pMOSFETs doped by low biased Plasma Doping", 2000 Symposium on VLSI Technology Digest of Technical Papers, IEEE, pp. 110-1111, 2000.

Y. Kiyota, "Surface Reaction Doping using Gas Source for Ultra Shallow Junctions", Japan Society of Applied Physics, 2000.

Y. Kiyota, et al., "Role of hydrogen during rapid vapor-phase doping analyzed by x-ray photoelectron spectroscopy and Fourier-transform infrared-attenuated total reflection", Journal of Vacuum Science and Technology A 16 (1), pp. 1-5, Jan./Feb. 1998.

Y. Kiyota, "Surface Reaction doping using Gas Source for Ultra Shallow Junction", Silicon Technology No. 39, pp. 9-11, Jun. 2002.

Y. Sasaki et al., "Gas Phase Doping at Room Temperature", Extended Abstracts of International Workshop on Junction Technology, pp. 39-40, 2002.

Y. Sasaki et al., $B_2H_6$ Plasma Doping with "In-situ He Pre-amorphization", 2004 Symposium on VLSI Technology Digest of Technical Papers, pp. 180-181.

Chinese Office Action issued in corresponding Chinese Patent Application No. CN 2004800046349, mailed Mar. 30, 2007.

U.S. Appl. No. 11/153,572.

U.S. Appl. No. 11/819,567.

Ito, T., et al., "Improvement of Threshold Voltage Roll-off by Ultra-shallow Junction Formed by Flash Lamp Annealing", 2003, Symposium on VLSI Technology Digest of Technical Papers.

Yamashita, F., et al., "Direct Joule Heating of Nd-Fe-B Based Melt-Spun Powder and Zinc Binder", 1999, IEEE.

Chu, P.K., et al., "Part one of two, Plasma Doping: Progress and potential", Solid State Technology, Sep. 1999, pp. 55-60, www.solid-state.com.

Chu, P.K., et al., "Part two of two, Plasma Doping: Progress and potential", Solid State Technology, Oct. 1999, pp. 77-82, www.solid-state.com.

Hori, A., et al., "CMOS Device Technology toward 50 nm Region—Performance and Drain Architecture—", IEDM, 1999, pp. 641-644, IEEE.

Kwok, Dixon T.K., et al., "Energy distribution and depth profile in $BF_3$ plasma doping", Surface and Coatings Technology, 2001, pp. 146-150, vol. 136, Elsevier Science B.V.

Yamashita, F., et al., "Nd-Fe-B Thin Arc-shaped Bonded Magnets for Small DC Motors Prepared by Powder Compacting Press with Ion-Implanted Punches", J. Mgn. Soc. Japan, 2001, pp. 683-686, vol. 25 No. 4-2.

Yamashita, F., et al., "Preparation of a solid Rotor Composed of a Highly Dense Ring-Shaped RE Bonded Magnet and an Iron-Dust Core", Trans. Magn. Soc. Japan., 2002, pp. 111-114, vol. 2 No. 3.

Mizuno, B., "Ultra Shallow Junction for sub-50NM CMOS—The role of Plasma Doping—", UJTLab, pp. 10-13, Ultimate Junction Technologies Inc.

Sasaki, Y., et al., "$B_2H_6$ Plasma Doping with In-situ He Pre-amorphization", Symposium on VLSI Technology Digest of Technical Papers, 2004, pp. 180-181, IEEE.

Sasaki, Y., et al., "Plasma Doped Shallow Junction Formation", Matsushita Technical Journal, Dec. 2004, pp. 404-409, vol. 50 No. 6.

Tsutsui, K., et al., "Doping Efects from Neutral $B_2H_6$ Gas Phase on Plasma Pretreated Si Substrates as a Possible Process in Plasma Doping", The Japan Society of Applied Physics, 2005, pp. 3903-0907, vol. 44 No. 6A.

Mizuno, B., et al., "De-Excitation Pathways of highly-Excited Self-Trapped Exciton and Electron Plus Self-Trapped Hole", Journal of the Physical Society of Japan, Jun. 1983, pp. 1901-1903, vol. 52 No. 6.

Mizuno, B., "Excitation-Induced Atomic Motion of Self-Trapped Excitons in RbCl: Reorientation and Defect Formation", Journal of the Physical Society of Japan, Sep. 1986, pp. 3258-3271, vol. 55 No. 9.

Mizuno, B., et al., "Effect of Hydrogen on Oxygen Removal from Silicon-Overlayer on Insulator formed by $O^+$ Implantation", pp. 637-640, Semiconductor Research Center, Matsushita Electric Industraial Co., Ltd.

Fujita, T., et al., "Electron Paramagnetic Resonance Studies of Defects in Oxygen-Implanted Silicon", Jaanese Journal of Applied Physics, Jul. 1987, pp. L1116-L1118, vol. 26 No. 7.

Mizuno, B., et al., "Effective removal of oxygen from Si layer on burned oxide by implantation of hydrogen", J. Appl. Phys., Sep. 1987, pp. 2566-2568, vol. 62 No. 6.

Mizuno, B., et al., "New doping method for subhalf micron trench sidewalls by using an electron cyclotron resonance plasma", Appl. Phys. Lett., Nov. 1988, pp. 2059-2061, vol. 53 No. 21, American Institute of Physics.

Shimizu, N., et al., "Reduction of Thickness Secondary Defects in MeV ion Impalted Silicon by Intrinsic Gettering", Extended Abstracts of the 21st Conference on Solid State Devices and Materials, Tokyo, 1989, pp. 177-180.

Hori, A., et al., "A 0.05 μm-CMOS with Ultra Shallow Source/Drain Junctions Fabricated by 5KeV Ion Implantation and Rapid Thermal Annealing", 1994, pp. 485-488, IEDM.

Hori, A., et al., "Fabrication and Characteristics of a Room Temeprature 0.05 μm-CMOS—Possibility and Design Concept of Sub-0.1 μm MOS Devices—", Technical Report of IEICE, 1995, pp. 41-46, The Institute of Electronics, Information and Communication Engineers.

Mizuno, B., et al. "Plasma doping for silicon", Surface and Coatings Technology, 1996, pp. 51-55, vol. 85, Elsevier Science S.A.

Mizuno, B., et al., "Plasma Doping of Boron for Fabricating the Surface Channel Sub-quarter micron PMOSFET", Symposium on VLSI Technology Digest of Technical Digest of Technical Papers, 1996, IEEE.

Takase, M., et al., "An evaluation method for a high concentration profile produced in very low energy doping processes", Nuclear Instruments and Methods in Physics Research, 1997, pp. 288-290, vol. 121, Elsevier Science B.V.

Takase, M., et al., "Suppressing Ion Implantation Induced Oxide Charging by Utilizing Physically Damaged Oxide Region", Jpn. J. Appl. Phys., Mar. 1997, pp. 1618-1621, vol. 36 Part 1, No. 3B.

Mizuno. B., et al., "Plasma Doping", pp. 165-170, Central Research Laboratory, Matsushita Electric Industrial Co., Ltd.

Kadokura, M., et al., "Analysis and Design of At-Cut Quartz Resonators by three dimensional finite element method", EEP—vol. 19-1, Advances in Electronic Packaging, 1997, pp. 1101-1108, vol. 1, ASME 1997.

Mizuno. B., et al., "Plasma Doping and Plasma-Less Doping of Semiconductor", Mat. Res. Soc. Symp. Proc., 1997, pp. 345-950, vol. 438, Materials Research Society.

Takase, M., et al, "New Doping Technology—Plasma Doping—for Next Generation CMOS process with Ultra Shallow Junction—LSI Yield and surface contamination issues—", 1997, pabes B9-B12, IEEE.

Takase, M., et al., "Shallow Source/Drain Extensions for pMOSFETs with High Activation and Low Process Damage Fabricated by Plasma Doping", IEDM, 1997, pp. 475-478, IEEE.

Jin, C.G., "Hard X-ray Photoelectron spectroscopy (HX-PES) study on chemical binding states of ultra shallow plasma-doped silicon layer for the application of advanced ULSI devices", 2006, pp. 116-119, IEEE.

Mizuno, B., et al., "Plasma Doping and Subsequent Rapid Thermal Processing for Ultra Shallow Junction Formation", 13th IEEE International Conference on Advanced Thermal Processing of Semiconductors—RTP, 2005, IEEE.

Mizuno, B., et al., "Plasma Doping", 2004, pp. 423-427, IEEE.

Sasaki, Y., et al., "Gas Phase Doping at Room Temperature", Extended Abstract of International Workshop on Junction Technology, 2002, pp. 39-40, Japan Society of Applied Physics.

Sasaki, Y., et al., "Helicon Wave Plasma Doping System", Extended Abstract of International Workshop on Junction Technology 2002, pp. 37-38, Japan Society of Applied Physics.

Jin, C.G., et al., "Estimation of Ultra-Shallow Plasma Doping (PD) Layer's Optical Absorption Properties by Spectroscopic Ellipsometry (SE)", 2004, pp. 102-103, IEEE.

Shimizu, N., et al., "Secondary Defect Reduction by Multiple MeV Boron Ion Implantation", Extended Abstract of the 22nd (1990 International) Conference on solid State Devices and Materials, Sendai, 1990, pp. 449-452.

Sasaki, Y., et al., "New method of Plasma doping with in-situ Helium pre-amorphization", Nuclear Instruments and Methods in Physics Research B 237, 2005, pp. 41-45, Elsevier B.V.

Jin, C.G., "Ultra shallow $p^+/n$ Junction formation by plasma doping (PD) and long pulse all solid-state laser annealing (ASLA) with selective absorption modulation", Nuclear Instruments and Methods in Physics Research B 237, 2005, pp. 58-61, Elsevier B.V.

Mizuno, B., et al., "Plasma Doping and Plasma-Less Doping for SI: Application to the sub-quarter micron Surface Channel PMOSFET and Solid Plasma Source Application for Safety Operation", Semiconductor Research Center, Matsushita Electric Industrial Co., Ltd.

Liu, H., et al., "A New Plasma-Aided Solid-Source Implantation Method for Ultra-Shallow p+/n Junction Fabrication", Engineering Research Center for Plasma-Aided Manufacturing, University of Wisconsin—Madison.

Mizuno, B., "Plasma Doping into the Side-Wall of a Sub-0.5 μm Width Trench", Extended Abstracts of the 19th Conference on Solid State Devices and Materials, Tokyo, 1987, pp. 319-322.

Mizuno, B., "Plasma Doping Technology", Applied Physics, 2001, pp. 1458-1462, vol. 70.

Takase, M., et al., "Shallow Source/Drain Extensions for pMOSFETs with High Activation and Low Process Damage Fabrication by Plasma Doping", Technical Report of IEICE, 1998, The Institute of Electronics, Information and Communication Engineers.

Mizuno, et al., "Ultralow Energy Doping Plasma Doping", Special Issue—Currently Developed Ion Engineering Technology-1.

Mizuno, B., et al., "Plasma Based Ion Implantation—Plasma Doping", High Temperature Science Journal, May 1996, pp. 114-120, vol. 3 No. 22.

Tatsumi, T., et al., "Multilevel Interconnection Technology using Fluorinated Amorphous Carbon films", 3p-ZX-3, Silicon Systems Research Laboratories, NEC Corporation.

Mizuno. B., et al., Plasma doping for fabricating ultra shallow junction, 3p-ZX-4, Matsushita Electric Industrial Co., Ltd.

Oda, H., et al., "Demand for Junction Technology in CMOS Transistors", 27a-ZL-1, 49th Applied Physics Lecture Series—Lecture Manuscripts, Comprehensive Lectures within the Area, 2002, Tokai University.

Mizuno, B., et al., "Junction Technologies: Status Quo and Perspectives", 27a-ZL-2, Comprehensive Lectures within the Area.

Hata, N., et al., "Characterization of Low-k Dielectrics by Z-ray Scattering—Anisotropy in Pore Diameter and its Suppression", 26p-M-19, 63rd Applied Physics Lecture Series—Lecture Manuscripts, 2002, Niigaka University.

Shimanuki, J., et al., "Behavior of pores in a thin low-k film during anneal—Ex-situ TEM observation method", 26p-M-20.

Sasaki, Y., et al., "In-situ Beam Current Monitor for Ion Implanter", 25a-G-1, pp. 768.

Higaki, R., et al., "Plasma Doping and Plasma Assisted Gas Doping", 25a-G-2, 63rd Applied Physics Lecture Series—Lecture Manuscripts, 2002, Niigaka University.

Kurosawa, J., et al., "Development of Ni-B-P-Pt type liquid metal Ion source for formation of Ni-nano dopant array by single ion implantation", 25a-G-3, 63rd Applied Physics Lecture Series—Lecture Manuscripts, 2002, Niigaka University.

Imamura, K., et al., "Development of key-techniques for co-doping of acceptor and donor by single ion implantation", 25a-G-4, 63rd Applied Physics Lecture Series—Lecture Manuscripts, 2002, Niigaka University.

Yamashita, K., et al., "Development of Flash Lamp Annealer for 300mm Wafers", 29p-ZW-10, 50th Applied Physiscs Lecture Series—Lecture Manuscripts, 2003, Shinagawa University.

Kubo, Y., et al., "Development of advance single ion implantor", 29p-ZW-11, 50th Applied Physiscs Lecture Series—Lecture Manuscripts, 2003, Shinagawa University.

Higaki, R., et al, "Dose Control of gas Phase Doping at Room Temperature" 29p-ZW-12, 50th Applied Physiscs Lecture Series—Lecture Manuscripts, 2003, Shinagawa University.

Akama, S., et al., "The Surface Reaction mechanism of Gas Phase Doping at Room Temperature", 29p-ZW-13, 50th Applied Physiscs Lecture Series—Lecture Manuscripts, 2003, Shinagawa University.

Sasaki, Y., et al., "Behavior of H and contamination in the Plasma Doping (PD) process", 29p-ZW-14, 50th Applied Physiscs Lecture Series—Lecture Manuscripts, 2003, Shinagawa University.

Kurobe, K., et al., "Ultra-shallow n+/p Junction Formation by Heat-assisted Excimer Laser Annealing", 29p-ZW-15, 50th Applied Physics Lecture Series—Lecture Manuscripts, 2003, Shinagawa University.

Fujinami, M., et al., "Research in Pores and Oxygen Compound Deficits in Si Due to the Positron Annihilation Coincidence Doppler Broadening Method, Positron Annihilation Coincidence Doppler Broadening Methods for Vacancy—Oxygen Complexes in Si", 1a-A-8, 64th Applied Physics Lecture Series—Lecture Manuscripts, 2003, Fukuoka University.

Miyagoe, T., et al., "Behavior Research on Deficits in Noble Gas Ion Implanted Si Using a Positron Beam, Positron beam study of defects induced by noble gas implanted Si", 1a-A-9, 64th Applied Physics Lecture Series—Lecture Manuscripts, 2003, Fukuoka University.

Higaki, R., et al., "Effects on the Substrate Surface conditions with Gas Doping Having Used Plasma Preprocessing, Effects of substrate surface condition on gas-phase doping using plasma pretreatment", 1a-A-10, 64th Applied Physics Lecture Series—Lecture Manuscripts, 2003, Fukuoka University.

Itoh, H., et al., "Ultra-low energy ion implantation in Si II", 30p-ZQ-9, Preprints of the 67th Meeting of the Japan Society of Applied Physics, 2006, Ritsumeikan University.

Matsuda, T., et al., "Spike RTA Induced Changes in Chemical Bondings and Their Depth Profile of Plasma-doped Boron", 30p-ZQ-10, Preprints of the 67th Meeting of the Japan Society of Applied Physics, 2006, Ritsumeikan University.

Tanaka, Y., et al., "8nm (5E18cm$^{-2}$) Ultra Shallow Junction Formation by Double-Pulsed Green Laser Annealing", 30p-ZQ-11, Preprints of the 67th Meeting of the Japan Society of Applied Physics, 2006, Ritsumeikan University.

Haya, A., et al., "Surface Modification of Plastic Substrate by Atomic Hydrogen Anneal and Effect of AHA to Film Deposition", 29p-SM-1, Preprints of the 54th Meeting of the Japan Society of Applied Physics and Related Societies, 2007, Aoyama Gakuin University.

Ohashi, Y., et al., "Effects of Hydrogenation on Chemical Activity of Defects in Polycrystalline Silicon Thin films", 29p-SM-2, Preprints of teh 54th Meeting of the Japan Society of Applied Physics and Related Societies, 2007, Aoyama Gakuin University.

Watanabe, M., et al., "Study of Activated Boron Depth Profiles and Ultra-Shallow P+ Layers Formed by Plasma Doping Method", 29p-SM-3, Preprints of the 54th Meeting of the Japan Society of Applied Physics and Related Societies, 2007, Aoyama Gakuin University.

Ishiba, T., et al., "Lattice Strains in High Energy Ion Implated Silicon Subjected to Thermal Annealings", 27a-SN-13.

Shimizu, N., et al., "Secondary Defect Reduction of Multiple MeV Ion Implatation (II)", 27a-SN-14.

Nakata, J., "The Low-Temperature Crystallization and Amorphization Mechanism of Amorphous Si by High Energy Heavy-Ion Beam Irradiation", 27a-SN-15.

Matsumoto, M., "The Influence of Pre-oxidation Cleaning on Grotwh of Oxide Film (II)", 28a-D-1.

Uchida, H., et al., "Influence of Cleaning methods on Dielectric Breakdown in Thin $Sio_2$," 28a-D-2.

Takiyama, M., et al., "Electrical Characteristics of Al MOS Diode Contaminated with Cu-I", 28a-D-3.

Shimizu, N., et al., "Secondary Defect Reduction of Multiple MeV Ion Implantation (III)", 31a-X-5.

Kimoto, K., et al., "Rapid Thermal Annealing for High-energy Ion Implanted Si (V)" 31a-X-6.

Koyama, Y., et al., "Rapid Thermal Annealing for High-energy Ion Implanted Si (VI)" 31a-X-7.

Suzuki, H., et al., "Preamorphization by si Double Ion Implantation", 9p-C-12.

Takamatsu, H., et al., "Evaluation of Anneal Effect by Photoacoustic Displacement Measurement", 9p-C-13.

Shimizu, N., et al., "Effects of Junction Leakage Current Reduction of Additional High Energy Si Ion Implantation", 9p-C-14.

Katsumoto, M., et al., "The Effect of NH40H/H202 Cleaning on C-V Characteristics of MOS Capacitor", 11p-B-12.

Shinno, H., "Ellipsometric Measurements of Silicon Surfaces During Oxidation in R.F. Plasma", 11p-B-13.

Maekawa, M., et al., "Effect of H2SO4 Boiling on Silicon Surface", 11p-B-14.

Mizuno, B., et al., "Plasma-assisted Impurity Doping for ULSIs", 28p-ZP-10.

Itatani, R., "Introductory Talk, Matrial Processing Induced by Electron Beam", 28p-ZQ-1.

Tanimura, S., et al., D-255 Total Management System for VLSI Manufacturing, 1994 Spring Conference of the Institute of Electronics, Information and Communication Engineers, Matsushita Electric Industrial Co., Ltd.

Maekawa, T., et al., "Annealing of Ar$^+$ Implanted Damage" 30p-ZK-2.

Okahisa, M., et al., "Electrical Properties of High Energy Boron-Implanted Layers in Si", 30p-ZK-3.

Shimizu, N., et al., "Effects of n+ Layer Formation on Junction Leakage Current Using High Energy Ion Implantation", 30p-ZK-4.

Kinoshita, K., et al., "Optical Property Change of Silicon in Low Energy Ion Implantation (II)", 28a-ZW-8.

Mizuno, B., et al., "A Sputtering Effect During the Ion Implantation with Low Energy", 28a-ZW-9.

Kagawa, K., et al., "Effect of Charging During Ion Implantation on Devices", 28a-ZW-10.

Murakoshi, A., et al., "Formation of Ultra Shallow Diffusion Layer by Ultra Low Energy Ion Implantation", 26p-ZN-10.

Mizuno, B., et al., "Plasma Doping Method", 26p-ZN-11.

Fukuda, K., et al., "Fabrication of Ultra Shallow Junction by Spin-on Glass $SiO_2$ Film" 26p-ZN-12.

Ishii, M., "Quantitative Analysis of rare-Gas Ion Bombardment Damage of Si Surface using XPS", 26p-ZP-6.

Takase, M., et al., "Evaluation Method of Hifh concentration Profile for Low Energy Ion Implantation", 26p-ZP-7.

Nakamura, T., et al., "Influence of simultaneously Implanted As+ ions on diffusivity and activation efficency of B atoms implanted into silicon", 26p-ZP-8.

Akiyama, H., et al., "The life-time control technique for power devices using high-energy heavy ion radiation", 28a-P-6.

Takase, M., et al., "The Indentification of the Region of Ion Implantation Induced Physical Damaged Layer", 28a-P-7.

Tamura, F., et al., "Measurement of the minority carrier lifetime for the Si epitaxial layer", 28a-P-8.

Mizuno, B., et al., "Room Temperature Vapor Phase Doping (RTVD)", 28p-P-4.

Mizuno, B., et al., "Plasma Doping Applicable to sub-1/4 micron PMOS", 28p-P-5.

Kujirai, H., et al., "Ultra-shallow, low resistance junction formation by solid-phase diffusion of boron from BSG", 28p-P-6.

Takase, M., et al., "Dosage Control by Plasma Emission in Plasma Doping Process", 7a-P-2.

Murakami, E., et al., "Formation of Ultrashallow Junctions by Sb Selective δ Doping Technique", 7a-P-3.

Kiyota, Y., et al., the Role of Hydrogen during Rapid Vapor-phase Doping Analyzed by FTIR-ATR, 7a-P-4.

Takase, M., et al., "Fabrication of Low Sheet Resistance and Shallow Source/Drain Junction with Plasma Doping Process", 29a-G-2.

Shimada, N., et al., "Shallow Junction, Formation by Polyatomic Cluster Ion Implantation", 29a-G-3.

Ishikawa, T., et al., "Formation of shallow junctions by low-energy implantation", 29a-G-4.

Shimada, N., et al., "Shallow Junction Formation by Decaborane Ion Impantation (IV)", 3a-PC-13.

Mineji, A., et al., "Shallow Junction Formation by 0.2 keV-single B Ion Implantation", 3a-PC-14.

Takase, M., et al., "High Activation Ultra Shallow Source/Drain Junction Fabricated by Plasma Doping", 3a-PC-15.

Nishida, S., et al., "the Herzog correction revisited", 7a-YP-8.

Ono, S., et al., "Design of a cryogenic current measuring device using a SQUID for low-intensity beams", 7a-YP-9.

Haruyama, Y., et al., "High resolution measurement of HeH$^+$ dissociative recombination with superconductor electron cooler", 7a-YP-10.

Tsurubuchi, S., et al., "Excitation cross sections for the resonance states of the Ne by electron impact", 7a-YP-11.

Wakabayashi, et al., "IEDM Focusing on high speed and low electric power techniques, Finally the Cu damascene technique for practical applications has arrived", IEDM Conference, 1997, IEEE.

Nakata, K., et al., "Fail Bit map Correlation Analysis System", The Institute of Electronics, Information and Communication Engineers (IEICE) Electronics Society Annual Meeting, 1995.

Tsubo, Y., et al., "Diffusion of Phosphorus from P-doped Polysilicon through Ultrathin siO2 into Si Substrate", 30p-ZP-11.

Aoyama, T., et al., "Boron Diffusion in Silicon Dioxide in the Presence of Hydrogen and Fluorine", 30p-ZP-12.

Takase, M., et al., "Effect of oxide thickness on boron profile in the plasma doping process", 30p-ZP-13.

Mizuno, B., et al., "Plasma Doping", Invitational Lecture.

Takase, M., et al., "Plasma doping Technology for the MOS transistor with a channel length below 0.15 µm", Applied Physics, 1999, vol. 68 No. 5.

Sasaki, Y., et al., "Nondestructive Beam Current Monitor Using DC SQUID", pp. 68-76.

Kobayashi, K., et al., "Three-Dimensional Plasma Doping for Beam-Channel Transistor", 29p-ZG-13, Preprints of the 51st Spring meeting of the Japan Society of Applied Physics and Related Societies, Mar. 2004, Tokyo University of Technology.

Sato, T., et al., "Effect of wet cleaning treatment on dose of impurity after plasma doping", 29p-ZG-14, Preprints of the 51st Spring meeting of the Japan Society of Applied Physics and Related Societies, Mar. 2004, Tokyo University of Technology.

Takagi, K., et al., "Profile control by Helium plasma treatment in plasma doping method", 29p-ZG-15, Preprints of the 51st Spring meeting of the Japan Society of Applied Physics and Related Societies, Mar. 2004, Tokyo University of Technology.

Okashita, K., et al., "In-situ Plasma Pre-amorphization for Shallow Junction Formation", 3p-P10-14, Preprints of the 65th Meeting of the Japan Society of Applied Physics and Related Societies, Sep. 2004, Tohoku Gakuin University.

Nakazawa, H., et al., "Characterization of Boron/Phosphorus Layer by Cold/Heat Ion Implantation", 3p-P10-15, Preprints of the 65th Meeting of the Japan Society of Applied Physics and Related Societies, Sep. 2004, Tohoku Gakuin University.

Kobayashi, K., et al., "Doping Profile Evaluation for Three-Dimensional Transistor", 3p-P10-16, Preprints of the 65th Meeting of the Japan Society of Applied Physics and Related Societies, Sep. 2004, Tohoku Gakuin University.

Otakagi, K., et al., "Effect on Impurity profile of Helium Plasma Treatment on a Plasma Doping Method", 65th Japan Society of Applied Physics Symposium Collection of Lectures, Sep. 2004, Tohoku Graduate Department.

Sauddin, H., et al., "Leakage Current in Mesa-type p+/n, Junctions Formed by Plasma Doping", 10a-A-10, PerPreprints of the 66th Meeting of the Japan Society of Applied Physics, 2005, Tokushima University.

Fukagawa, Y., et al., "Electrical Properties of ultra-Shallow p+ Layers Formed by Plasma Doping", 10a-A-11, PerPreprints of the 66th Meeting of the Japan Society of Applied Physics, 2005, Tokushima University.

Matsuda, T., et al., "Chemical Bonds of Boron Atoms Implanted in a Silicon Surface by Plasma Doping", 10a-A-12, PerPreprints of the 66th Meeting of the Japan Society of Applied Physics, 2005, Tokushima University.

Mizuno, B., et al., "Reduction of lattice defect in Si layer on buried oxide by implantation of hydrogen,", SDM 87-169, Basic Research Lab., Semiconductor Research Center, Matsushita Electric Industrial Co., Ltd.

Mizuno, B., et al., "ECR Plasma Doping", SDM 88-95, Semiconductor Research Center, Semiconductor Basic Research Lab., Matsushita Electric Industrial Co., Ltd.

Mizuno, B., et al., "ECR Plasma Doping", Electronic Material, Dec. 1987.

Mizuno, B., "Plasma Doping Technology", Semiconductor Research Center, Matsushita Electric industrial Co., Ltd.

Nakada, K., et al., "D-259 Development of Cleanroom Auto Control System", 1994 Spring Conference of the Society of Electronic information and Communications.

Mizuno, B., et al., "Behavior of Implanted Ions Near the Surface—Outer Diffusion and Self-sputtering", 28p-ZL1.

Yamanishi, Y., et al., "Behavior during Oxidation of Nitrogen Introduced by Ion Implantation", 28p-ZL2.

Zaizu, Y., et al., "Effects of Silicon Nitride Films on Boron Enhanced Diffusion and Crystalline Defects due to Boron Implantation", 28p-ZL3.

Mizuno, B., et al., "Behavior near Surface of Implanted Ions (cont'd) Self-sputtering and Back-scattering", 20p-ZE-11.

Kinoshita K., et al., "Optical Changes in Association with Crystalline Damage due to Low Energy Ion Implantation (IV)", 20p-ZE-12.

Hasegawa, K., et al., "Dual Species (B, As) Implantation in Silicon", 28p-ZE-13.

Sato, T., et al., "Dose Volume changes and HF Cleansing Before and After Plasma Doping Change dose caused by HF treatment before and after plasma doping", 1a-A-11, 64th Applied Physics Lecture Series—Lecture Manuscripts, 2003, Fukuoka University.

Susuki, K., "High Tilt Angle Ion Implantation in Polycrystalline Si, High tilt angle ion implantation into Polycrystalline silicon", 1p-A-1, 64th Applied Physics Lecture Series—Lecture Manuscripts, 2003, Fukuoka University.

Yamada, M., et al., "Evaluation of Junction Leak Current Caused by Element Isolation Stress, Study of junction leakage currents induced by the stress of shallow trench isolation", 1p-A-2, 64th Applied Physics Lecture Series—Lecture Manuscripts, 2003, Fukuoka University.

Aiba, I., et al., "Dose Variation by Chemical Cleaning Process after Plasma Doping", 3p-P10-18, 65th Japan Society of Applied Physics Symposium Collection of Lectures, Sep. 2004, Tohoku Graduate Department.

Majima, M., et al., "Hall Effect Measurement of ultra Shallow p$^+$n Junctions formed by Plasma Doping", 3p-P10-19, 65th Japan Society of Applied Physics Symposium Collection of Lectures, Sep. 2004, Tohoku Graduate Department.

Masuda, T., et al., "Amorphization of Large-scale Silicon Substrate by using hybrid Quantum Chemical Molecular Dynamics Method", 1a-YE-7, 52nd Japan Society of Applied Physics Symposium Collection of Lectures, 2005, Saitama University.

Fukugawa, Y., et al., "Examination of pre-amorphous layer formation process by He plasma irradiation", 1a-YE-8, 52nd Japan Society of Applied Physics Symposium Collection of Lectures, 2005, Saitama University.

Aiba, I., et al., "Plasma Doping on Si substrates with Resist Patterns", 1a-YE-9, 52nd Japan Society of Applied Physics Symposium Collection of Lectures, 2005, Saitama University.

Okashite, K., et al., "Ultra Shallow Junction Formation with Plasma Doping and Spike RTA", 1a-YE-10, 52nd Japan Society of Applied Physics Symposium Collection of Lectures, 2005, Saitama University.

Sauddin, H., "Leakage Current Characteristics of Ultra-shallow p+/n Junctions Formed by Plasma Doping", 1a-YE-11, 52nd Japan Society of Applied Physics Symposium Collection of Lectures, 2005, Saitama University.

Matsuno, A., et al., "One Dimensional Thermal Diffusion Simulation for the USJ formation by green laser anneal with absorption layer", 16-YE-1, 52nd Japan Society of Applied Physics Symposium Collection of Lectures, 2005, Saitama University.

Mizuno, B., et al., "ECR Plasma Doping", Matsushita Electric Industrial Co., Ltd.

Higaki, R., et al., "Effects of gas phase absorption into Si substrates on plasma doping process".

Lenoble, D., et al., "Fabrication of 60-nm plasma doped CMOS transistors", 2002, IEEE.

Severi, S., et al., "Diffusion-less junctions and super halo profiles for PMOS transistors formed by SPER and FUSI gate in 45nm physical gate length devices", 2004, IEEE.

International Search Report issued in International Patent Application No. PCT/JP2005/009949 dated Jul. 5, 2005.

International Search Report issued in International Patent Application No. PCT/JP2004015308 mailed Jan. 18, 2005.

Japanese Notification of Reasons for Refusal, w/ English translation thereof, issued in Japanese Patent Appliction No. JP 2005-502685 dated May 19, 2009.

European Search Report issued in European Patent Application No. EP 04710478 dated May 12, 2009.

Tsutsui, K., et al., "Contribution and Control of Neutral Gas Absorption Effects in the Plasma Doping of Boron into Si", 2004, pp. 46-49, IEEE.

Baek, S., et al., "Characteristics of Low-Temperature Preannealing Effects on Laser-Annealed $P^+/N$ and $N^+/P$ Ultra-Shallow Junctions", 2004, pp. 54-57, IEEE.

Semiconductor Applications, Microcavity Engineering, Trench Doping, pp. 662-667.

R. Siegele, et al., "Helium Bubbles in silicon: Structure and optical properties," Appl. Phys. Left. 66 (11), Mar. 13, 1995, pp. 1319-1321.

V.F. Reutov & A.S. Sokhatskii, "Helium Ion Bombardment Induced Amorphization of Silicon Crystals," Technical Physics Letters, vol. 38, No. 7, 2002, pp. 615-617.

P. Roca i Cabarrocas, "Plasma enhanced chemical vapor deposition of silicon thin films for large area electronics," Current Opinion in Solid State and Materials Science 6 (2002) 439-444.

Taiwanese Office Action issued in Taiwanese Patent Application No. TW 093130808 dated Mar. 16, 2011.

* cited by examiner

METHOD FOR MAKING JUNCTION AND PROCESSED MATERIAL FORMED USING THE SAME

TECHNICAL FIELD

This invention relates to a method for making a junction and a processed material formed using the same, and more particularly to a method for making a junction for forming an electronic device on a semiconductor substrate and a method for making a junction for forming an electronic device on a substrate on which a semiconductor thin film is formed on an insulating substrate surface, which is used for a liquid crystal panel.

BACKGROUND ART

For example, in forming device regions in a semiconductor substrate, a large number of pn junctions are used. An SOI (silicon on insulator) with a silicon thin film formed on a substrate surface through an insulating film has been widely employed for several semiconductor devices such as DRAM. Further, a glass substrate with a semiconductor thin film formed on a substrate surface is widely noticed by attempting miniaturization and high speed of a liquid crystal panel through integration of a driving circuit of liquid crystal including a thin film transistor (TFT) in the semiconductor thin film.

As described above, in forming various semiconductor devices, pn junctions are employed. In order to form these pn junctions, traditionally, a method has been adopted in which after p-type impurities such as boron are introduced in an n-type Si substrate thorough ion implantation, they are electrically activated by a halogen lamp.

For example, as a method for introducing boron that is the p-type impurities, in addition to the ion implantation, plasma doping is expected as a next-generation method capable of effectively introducing particles with very low energy.

As a method for electronically activating the ions such as the boron ions introduced, a method for applying xenon flash lamp light, entire-solid laser light or excimer laser light in addition to halogen lamp light has been researched and developed.

All the xenon flash lamp light, solid laser light and excimer laser light have an intensity peak at a shorter wavelength than the halogen lamplight. For example, the conventional halogen lamp light has the intensity peak at 1000-1100 nm, whereas the xenon lamp light has the intensity peak at the wavelength of 400-500 nm and the excimer laser light has the intensity peak at the wavelength of 400 nm or less. Since they have the peak at a shorter wavelength, they can be effectively absorbed in silicon (Si) (see Non-patent References 1 and 2). Thus, by absorbing light energy at a shallow portion in a substrate surface, a shallow activated layer can be formed.

Further, a method has been also proposed for forming a shallow activated layer using a difference in a light absorption coefficient between silicon crystal and amorphous silicon. Specifically, in a wavelength range of 375 nm or longer, the amorphous silicon has a larger light absorption efficient than the silicon crystal. Thus, an amorphous layer is previously formed on a Si substrate surface before irradiated with light, and thereafter light is applied to cause the amorphous layer to absorb more light energy, thereby making a shallow activated layer. The amorphous layer is formed by ion-implanting e.g. germanium (see Non-patent References 1, 2, 3, 4 and 5).

By these research researches, a result has been reported in which the light with a shorter wavelength ranging from 375 nm (inclusive) to 800 nm (inclusive) is applied to cause the substrate to effectively absorb the light energy, thereby making a shallow junction (see Non-patent References 1 and 2). In these reports, generally, prior to introduction of impurities, the substrate surface is previously changed to be amorphous and thereafter the impurities are introduced. In this case, for impurity introduction, ion-implantation of $BF^{2+}$ or $B^+$ is adopted and for previous amorphous-changing, ion-implantation of germanium or silicon is adopted. Namely, ion implantation must be twice carried out. This led to a problem that the process is complicated. Further, in order to make the shallow junction, in the case of ion-implantation of $BF^{2+}$ or $B^+$, an accelerating voltage must be lowered to several hundreds V so that the beam current value is lowered. This led to a problem of low throughput. Furthermore, since there are many combinations of twice-ion-implantation conditions and the methods for introduction and electronic activation of boron are often individually researched and developed, under present circumstances, the state of the substrate surface suitable to the wavelength of an electromagnetic wave to be applied is not still known.

Non-patent Reference 1: Ext. Abstr. of IWJT, pp 23-26, Tokyo, 2002.

Non-patent Reference 2: Symposium on VLSI Technology Digest of Technical Papers, pp 53-54, Kyoto, 2003.

Non-patent Reference 3: Ext. Abstr. of IWJT, pp 31-34, Tokyo, 2002.

Non-patent Reference 4: Ext. Abstr. of IWJT, pp 27-28, Tokyo, 2002.

Non-patent Reference 5: 2000 International Conference on Ion Implantation Technology Proceedings, 2000, pp. 175-177.

DISCLOSURE OF THE INVENTION

In a method for making a junction in which after impurities have been introduced in a solid substrate such as a Si substrate, they are electrically activated by application of an electromagnetic wave, for impurity introduction, ion-implantation of $BF^{2+}$ or $B^+$ is adopted and for previous amorphous changing, ion-implantation of germanium or silicon is adopted. In this case, ion implantation must be twice carried out. This led to a problem that the process is complicated. Further, in order to make the shallow junction, in the case of ion-implantation of $BF^{2+}$ or $B^+$, an accelerating voltage must be lowered to several hundreds V so that the beam current value is lowered. This led to a problem of low throughput. Furthermore, since there are many combinations of twice-ion-implantation conditions and for other reasons, the state of the substrate surface suitable to the wavelength of an electromagnetic wave to be applied is not still known. The method for making the substrate surface adapted to the electromagnetic wave to be applied is not still established.

Under such a circumstance, a method for making the state of the substrate surface adapted to the wavelength of the electromagnetic wave to be applied, which is simple in the process, and high in the throughput as compared with conventional ion implantation, has-been demanded.

This invention has been accomplished in view of the above circumstances. An object of this invention is to provide a method for making a junction which can make a shallow junction with high accuracy and high throughput through a simple process.

In order to attain the above object, in the method according to this invention, the suitable state of a substrate surface adapted to the wavelength of light (electromagnetic wave) to be applied is formed, and thereafter the light (electromagnetic wave) is applied to electrically activate the impurities.

The inventors of this invention found that the light absorption coefficient, reflectivity, absorptance of light and the thickness of a doped layer can be adjusted by changing a plasma condition through the experiments of repeating the creation of samples in which boron is introduced in a Si substrate with changed conditions of plasma doping and evaluation of the optical property of each the sample surfaces using an ellipsometer. Further, the inventors also theoretically found that the plasma condition and light to be applied to electrically activate the boron can be appropriately combined so that the sample effectively absorbs the light to electrically activate the impurities introduced at a high rate, the layer containing the boron is selectively excited to preferably activate the boron within the layer, and the impurities are prevented from being diffused at a deep position of the Si substrate. This invention has been accomplished paying attention to this point.

This invention provides a method for making a junction in which after impurities have been introduced in a solid substrate of Si, an electromagnetic wave is applied to activate the impurities, characterized in that He plasma is applied before the electromagnetic wave is applied. This is because the light absorptance of the Si substrate surface for the light ranging from 375 nm to 800 nm is greatly improved by applying the He plasma. In place of the He plasma, Ar plasma may be adopted. Otherwise, the plasma containing the element to be impurities diluted with He or Ar can also provide the same effect.

Namely, the method for making a junction includes the steps of:

forming, on the surface of a semiconductor substrate, a thin film containing an element that can be electrically activated within the semiconductor substrate; and applying light having an intensity peak at a wavelength longer than 375 nm (inclusive) on the semiconductor substrate so that the thin film is selectively excited thereby to electrically activate the element within the thin film.

Now, it is assumed that the "light" means the light in the broad sense inclusive of an electromagnetic wave. The energy for selective excitation is not desired to have a narrow band like laser, and is desired to be the light not having directivity. This is because the high light absorptance of the thin film for the wavelength over a wide range can be effectively employed. In contrast, the narrow band energy like the laser employs the absorptance for a specific wavelength of the thin film.

Further, the laser can be applied to only a small area because of its limitative output. Therefore where it is desired that the energy is applied to a relatively larger area like e.g. 1 cm×1 cm or more to process the product, the method of scanning is adopted. This requires dealing with the manufacturing shortcoming of limited throughput. On the other hand, a halogen lamp or xenon lamp, which can apply the light over a wide range of wavelength onto a large area, does not give rise the above problem and hence is desirable.

Incidentally, the thin film containing the element which can be electrically activated is generally formed through modification by plasma doping for the semiconductor substrate. Otherwise, it is formed through modification by plasma doping for the semiconductor substrate and also by doping the element which can be electrically activated within the semiconductor substrate. Further, it may be also formed by making deposit on the surface of the semiconductor substrate. For example, the thin film containing the element which can be electrically activated within the semiconductor substrate may be formed after the surface of the semiconductor substrate has been made amorphous by plasma application. Otherwise, the thin film containing the element which can be electrically activated within the semiconductor substrate may be formed by making the surface of the semiconductor substrate amorphous by plasma application after the element which can be electrically activated has been introduced in the semiconductor substrate.

In the method for making a junction, preferably, the light applying step satisfies at least one of conditions that with respect to the light absorptance of the thin film, assuming that the wavelength is $\lambda$ (nm) and the absorptance is A (%), at the wavelength ranging from 375 nm (inclusive) to 500 nm, $A > 7E32\lambda^{-12.316}$; at the wavelength ranging from 500 nm (inclusive) to 600 nm, $A > 2E19\lambda^{-7.278}$; at the wavelength ranging from 600 nm (inclusive) to 700 nm, $A > 4E14\lambda^{-5.5849}$; and at the wavelength ranging from 700 nm (inclusive) to 800 nm, $A > 2E12\lambda^{-4.7773}$.

In the method for making a junction according to this invention, preferably, the light applying step satisfies at least one of conditions that with respect to the light absorption coefficient of the thin film, assuming that the wavelength is $\lambda$ (nm) and the absorption coefficient is $\alpha$ (cm$^{-1}$), at the wavelength ranging from 375 nm (inclusive) to 500 nm, $\alpha > 1E38\lambda^{-12.505}$; at the wavelength ranging from 500 nm (inclusive) to 600 nm, $\alpha > 1E24\lambda^{-7.2684}$; at the wavelength ranging from 600 nm (inclusive) to 700 nm, $\alpha > 2E19\lambda^{-5.5873}$; and at the wavelength ranging from 700 nm (inclusive) to 800 nm, $\alpha > 1E17\lambda^{-4.7782}$.

In these methods, since the absorptance can computed according to the wavelength for application on the basis of several kinds of experimental results, the thin film can be effectively annealed.

Further, in the method for making a junction according to this invention, preferably, the semiconductor substrate is an n-type silicon (Si) substrate, and the impurity is boron to be supplied to the surface of the Si substrate.

Further, in the method for making a junction according to this invention comprising the steps of: introducing boron as impurities in an n-Si(100) substrate and an n-Si (100) substrate with a plane inclined by several degrees by plasma doping; and applying laser light from 375 nm (inclusive) to 800 nm (inclusive) to the boron-introduced n-Si(100) substrate so that the boron is electrically activated, preferably, the boron-introduced n-Si(100) substrate has a light absorptance of $A > 1E19\lambda^{-6.833}$ for the light from 375 nm (inclusive) to 800 nm (inclusive).

In the method for making a junction according to this invention comprising the steps of: introducing boron as impurities in an n-Si(100) substrate and an n-Si (100) substrate with a plane inclined by several degrees by plasma doping; and applying laser light from 375 nm (inclusive) to 800 nm (inclusive) to the boron-introduced n-Si(100) substrate with so that the boron is electrically activated, preferably, the boron-introduced n-Si(100) substrate has a light absorptance of $A > 1E19\lambda^{-7.1693}$ for the light from 375 nm (inclusive) to 800 nm (inclusive).

Further, in the method for making a junction according to this invention, the impurity introducing step is to apply plasma containing boron diluted with He to the n-Si(100) substrate and n-Si (100) substrate with a plane inclined by several degrees, for its plasma doping.

Further, in the method for making a junction according to this invention, preferably, the light absorption coefficient is measured by an ellipsometer with an incident angle of 70 degrees for a three-layer structure consisting of air, the thin film (boron-introduced layer) and the semiconductor substrate.

Further, in the method for making a junction according to this invention, preferably, after the light absorption coefficient and the thickness of the boron-introduced layer have been measured by an ellipsometer with an incident angle of 70 degrees for a three-layer structure consisting of air, the thin-film and the semiconductor substrate, assuming that the thickness of the boron-introduced layer is D (cm), the light absorptance is computed as $A=100 \times (1-\exp(-\alpha \cdot D))$.

Further, in the method for making a junction according to this invention, prior to the application of the electromagnetic wave, carried out is a combination of steps of applying He plasma, Ar plasma, plasma containing He or plasma containing Ar to the semiconductor substrate, and applying the plasma containing particles serving as impurities to the solid substrate, for its plasma doping. For example, preferably, after the Si substrate has been irradiated with the He plasma, plasma doping is carried out with the plasma containing boron. Otherwise, after the plasma doping by the plasma containing boron, the Si substrate may be irradiated with the He plasma.

In accordance with this invention, the light absorption coefficient can be tested through the measurement using an ellipsometer with an incident angle of 70 degrees for a three-layer structure consisting of air, the boron-introduced layer and the semiconductor substrate. Further, after the light absorption coefficient and the thickness of the boron-introduced layer have been measured by an ellipsometer with an incident angle of 70 degrees for a three-layer structure consisting of air, the boron-introduced layer and the semiconductor substrate, assuming that the thickness of the boron introduced layer is D (cm), the light absorptance can be computed as $A=100 \times (1-\exp(-\alpha \cdot D))$.

This invention satisfies the condition of the absorption coefficient so that the boron is effectively activated, thereby permitting a shallow junction to be effectively formed.

It is also effective to replace the n-Si(100) substrate by the semiconductor thin film formed on an SOI substrate, a distorted Si substrate or a glass substrate.

Further, the semiconductor device manufactured by the above method for making a junction or the electronic element such as a liquid-crystal substrate made using it are also effective.

Further, in this invention, in the above method for making a junction, the optical property of the substrate may be detected by ellipsometry or XPS.

Further, in this invention, in the above method for making a junction, the plasma doping step includes to control at least one of a power source voltage applied to plasma, plasma composition or ration between the time of plasma application containing the dopant material and the time of plasma application not containing the dopant material.

By this method, the control can be effectively carried out. In this case, the plasma composition is controlled by adjusting the mixing ratio between the impurity substance serving as the dopant and other substances, vacuum degree, mixing ratio between the other substances, etc.

Further, in this invention, in the method for manufacturing the substrate, the plasma doping step includes a step of controlling the optical property of the impurity-introduced region by changing the mixing ratio between the impurity substance and the inert substance or reactive substance serving as the substance to be mixed with the impurity substance. In this case, the optical property is controlled by changing the ratio between the impurity substance such as arsenic, phosphorus, boron, aluminum, antimony or indium and the inert substance such as helium, argon, xenon or nitrogen or reactive substance such as oxygen, silane or disilane, serving as the substance to be mixed with the impurity substance.

Further, in the method for making a junction according to this invention, preferably, the plasma doping step sets the optical constant of the impurity-introduced region so that in the annealing step, the electrical activation of the impurities contained in the impurity-introduced region is promoted and the energy absorption in the substrate is suppressed.

By this method, the annealing can be realized selectively and effectively without rising the substrate temperature.

In this case, the energy applied for the annealing may be not only the light energy but also may be the electromagnetic wave in the broad sense. The light source may be not only the halogen lamp light such as the xenon flash lamp but also white light, entire-solid laser light or excimer laser light.

All the xenon flash lamp light, solid laser light and excimer laser light have an intensity peak at a wavelength shorter than the halogen lamp light. For example, a conventional tungsten halogen lamp light has an intensity peak at 1000 to 1100 nm, whereas the xenon flash lamp light and the excimer laser light have an intensity peak at the wavelength of 400 to 500 nm and at 400 nm or less, respectively. These kinds of light has the intensity peak at the shorter wavelength so that the light can be effectively absorbed in Si (see Non-patent references 1 and 2). Thus, the light energy can be absorbed at a shallow portion in the substrate surface so that a shallow activated layer can be formed.

It should be noted that the impurity introducing step, as concretely described in the following embodiment, is not only simply introducing impurities, but in the annealing step of mainly light application subsequently executed, simultaneously or sequentially supplying the impurity substance, the inert substance such as inert gas or nitrogen and reactive substance such as oxygen, silane or disilane in their combination so that energy can be effectively absorbed, thereby setting the optical property optimum to the annealing step. The impurity introducing step in this invention refers to the above series of steps.

Further, in this invention, the light applying step can be replaced by the step of applying the electromagnetic wave. The addition of the electromagnetic component permits the annealing to be selectively carried out more effectively within the thin film.

As described above, in accordance with this invention, the state of the substrate surface is adjusted in terms of the thickness, impurity concentration, etc. according to the theoretical value based on the wavelength so as to facilitate the activation of impurities such as boron so that the annealing can be effectively carried out. Namely, since the impurities are effectively activated in the region where the impurities exist, the impurity elements existing within the semiconductor thin film or contiguous thereto are effectively diffused in the semiconductor thin film and so can be effectively activated, thereby effectively making the junction at the shallow position.

Thus, it is possible to provide a method for making a junction which is simple in the process and high in the throughput, and applies an electromagnetic wave to electrically activate impurities after the suitable state of the substrate surface adapted to the wavelength of the electromagnetic wave to be applied has been prepared.

Figure 1:
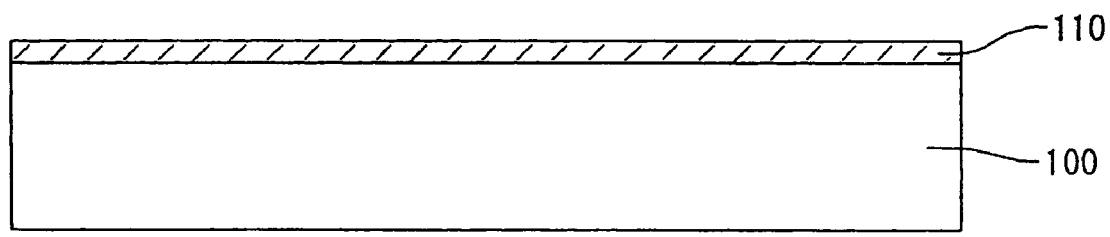
FIG. 1 is a view showing a substrate according to an embodiment of this invention.

Incidentally, reference numeral 100 denotes a semiconductor substrate; 110 an impurity thin film; 200 a vacuum chamber; 210 a vacuum pump; 230 a vacuum meter; 240 a plasma source; 250 a power source; 260 a substrate holder; 270 a power source; 280 a line for supplying a dopant substance; 290 a line for supplying another substance 1; 200 a line for supplying another substance 2; 310 plasma; and 410 a photometer.

BEST MODE FOR CARRYING OUT THE INVENTION

Next, an explanation will be given of various embodiments of this invention.

Now, by detecting the state of a substrate having a thin film with introduced impurities through optical measurement, it can be placed in a status optimum for activation. This means that not only are optically measured the impurities themselves, but also the substrate state is optically measured as that of a composite layer inclusive of the crystalline state of the thin film itself, physical change in the crystalline state of the thin film such as the damage due to energy in introduction and chemical change in the thin film such as creation of an oxide layer or nitride layer.

Embodiment 1

In the first embodiment, the basic construction of a substrate will be explained. As seen from FIG. 1, on an n-Si (100) substrate 100 is formed an impurity thin film 110 containing as a main component the impurities which can be carriers when electrically activated within the substrate.

Namely, the impurity thin film 110 is formed of an amorphous thin film containing a large quantity of lattice defects.

This state can be obtained, for example by introducing impurities in a semiconductor substrate using particles with energy (several 10 eV or more) sufficiently higher than the binding energy of lattices. Where the particles with energy (several 10 eV or more) sufficiently higher than the binding energy of lattices are used in order to introduce the impurities in the semiconductor thin film, the physical property of the semiconductor thin film will be changed owing to the creation of the lattice defects for the lattices of the crystalline or amorphous substance which constitutes the semiconductor substrate or the semiconductor thin film formed thereon and owing to the impurity substance itself. Thus, the impurity thin film 110 having the physical property different from the essential semiconductor substrate or the semiconductor thin film will be formed. Further, in this case, the lattice defects are introduced into the semiconductor substrate 100 itself so that the semiconductor substrate is placed in the status changed from its inherent physical property.

Figure 2:
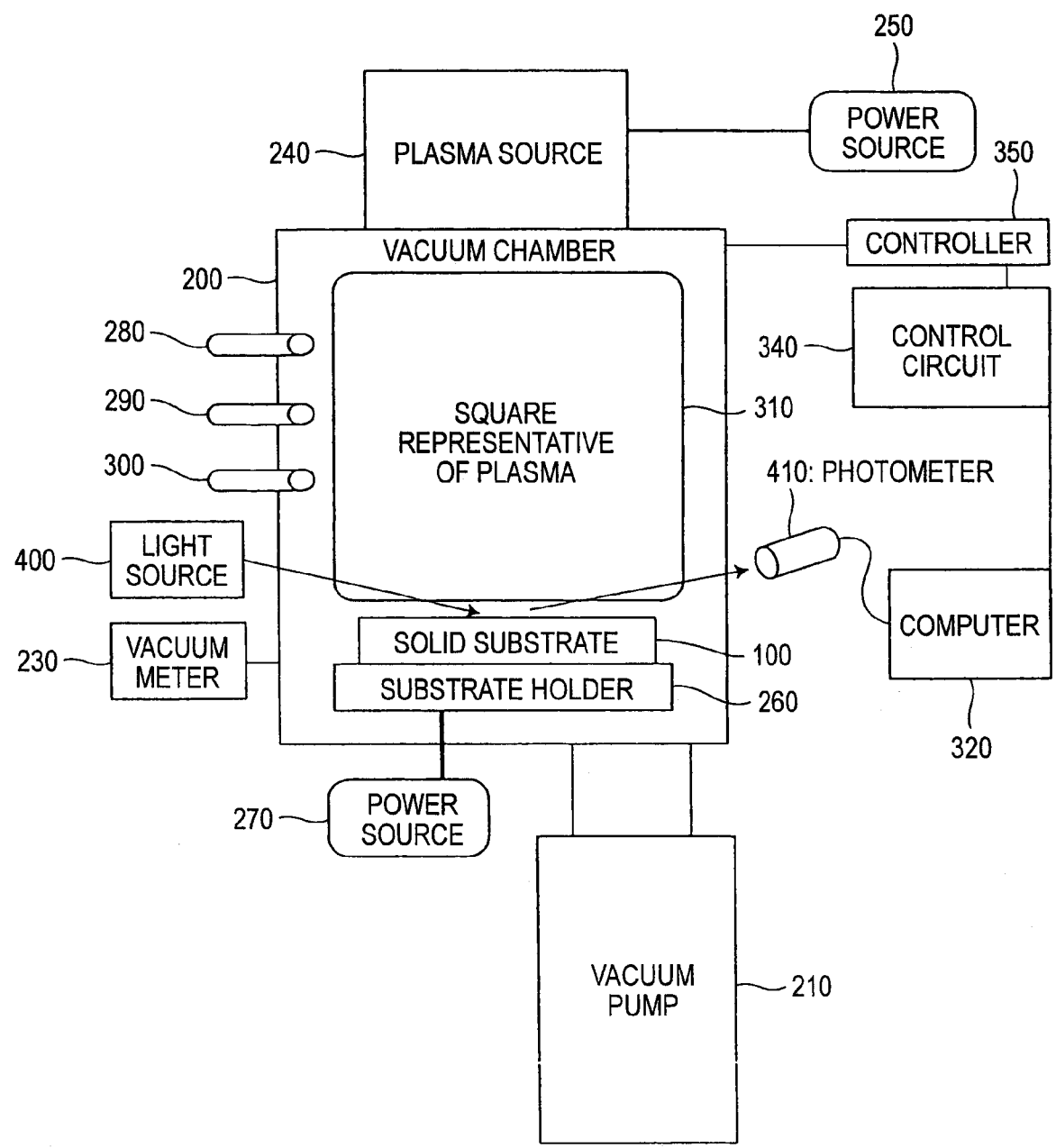
FIG. 2 is a view showing a doping apparatus for making a junction according to an embodiment of this invention.

First, an explanation will be given of a plasma doping apparatus serving as a plasma CVD apparatus employed in this embodiment. The doping apparatus employed in this embodiment, as seen from FIG. 2, is used to introduce impurities in the semiconductor substrate 100 to form the impurity thin film 110.

Now, this apparatus includes a light source 400 and a photometer 410 which serve as a measuring means for measuring the optical property of the semiconductor substrate 100 on the surface of which the impurity thin film 110 with the introduced impurities is formed as described later, and a control means for controlling the doping condition on the basis of the optical property obtained by the measuring means, thereby feedback-controlling the doping condition to provide an optimum surface status.

Specifically, the plasma doping apparatus includes a vacuum chamber 200 and a plasma source 240 for creating plasma with the vacuum chamber 200, thereby performing plasma doping for the surface of the semiconductor substrate 100 placed on a substrate holder 260 and serving as a substrate to be processed.

And the vacuum chamber 200 is connected to a vacuum pump 210 and to a vacuum meter 230 for vacuum measurement. The plasma source 240 is connected to a power source 240. The substrate holder 260 is connected to a power source 270 for applying an individual electrical potential, which are separated from the above power sources.

The vacuum chamber 200 is provided with a gas introducing mechanism for introducing these gases. This gas introducing mechanism consists of a first line 280 for supplying a first substance serving as a dopant substance, a second line 290 for supplying a second substance which is another substance (in this embodiment, He) and a third line 300 for supplying a third substance which is still another substance (in this embodiment, Ar).

Further, as required, the plasma doping apparatus may include a control apparatus consisting of a computer 320 for computing the optical property measured by the photometer 410, a control circuit 340 for determining the control condition on the basis of the computed result and a controller 350 for feedback-controlling the doping condition of the plasma doping apparatus on the basis of an output from the control circuit 340.

First, with the vacuum chamber adjusted to a predetermined pressure, a gas is supplied by an ordinary manner to create plasma and perform doping.

Now, an explanation will be given of the case using the gas as a doping source.

First, the dopant substance serving as a first gas is supplied into the vacuum chamber 200. In this case, in addition to the dopant substance, the other substance different therefrom serving as a carrier gas or having a particular function is also introduced. In this embodiment, the gas different from the dopant substance in their property, such as inert gas (different in the mass) or substance not electrically activated within Si was selected. Examples of such a gas are He and Ar. In this embodiment, as the other second substance, He was selected, and as the third substance, Ar was selected. From the gas introducing lines consisting of the above first to third lines 280, 290 and 300, the gases are introduced to generate plasma 310 on the surface of the solid substrate 100 located within the vacuum chamber 200.

Owing to an electrical potential difference between the plasma 310 and the semiconductor substrate 100 surface, charged particles in the plasma are attracted to perform the impurity doping. Simultaneously, an electrically neutral substance within the plasma is applied or occluded in the vicinity of the surface of the solid substrate 100. In this case, the surface status depends on the status of the semiconductor substrate 100 which is an underlying material and the energy of the plasma in the applied or occluded state. Now, the above electrically neutral substance is occluded in the semiconductor substrate 100 and also applied to the surface of the semiconductor substrate 100 so as to form an impurity thin film.

By this impurity doping step, the impurity introduced layer 110 explained in the above embodiment is formed on the semiconductor substrate 100 surface. Desirably, in order to measure the physical property of the impurity introduced layer, the vacuum chamber 200 incorporates the light source 400 and the photometer 410. And the optical property measured by the photometer 410 is operated by the computer 320; the operated result is sent to the control circuit 340; and the data are sent to the controller 350 as feedback information. Thus, the plasma doping apparatus adjusts the plasma condition to control the physical property of the impurity introduced layer.

The plasma condition to be adjusted includes a power source voltage to be applied to the plasma or voltage applying time and timing, mixing ratio between the dopant substance and other substances, vacuum degree, mixing ratio between the other substances, ratio between the application time of the plasma containing the plasma and that of the plasma not containing the plasma, etc. By changing these parameters, the physical property of the impurity introduced layer is controlled.

By performing the doping for the semiconductor substrate 100 with a sufficiently low electrical potential difference, e.g. 20 eV, the impurity thin film layer is formed on the semiconductor substrate 100.

On the other hand, by performing the doping for the semiconductor substrate 100 with a sufficiently high electrical potential difference, e.g. 200 eV, if the plasma containing a large quantity of impurities is in direct contact with the semiconductor thin film, ions with sufficiently high energy invade the semiconductor thin film surface, thereby forming the impurity thin film 110 which is the impurity introduced layer on the surface of the semiconductor substrate 100. Where the carrier gas is employed, the ions in the plasma of the carrier gas also invade the semiconductor thin film surface and are mixed with the impurities while breaking the crystals, thereby forming a mixture layer of an amorphous semiconductor layer and a boron layer. Thereafter, if the concentration of the impurity, e.g. boron on the mixture layer exceeds the saturated quantity containable in the mixture layer surface, an amorphous boron thin film (impurity thin film) is formed.

Figure 3:
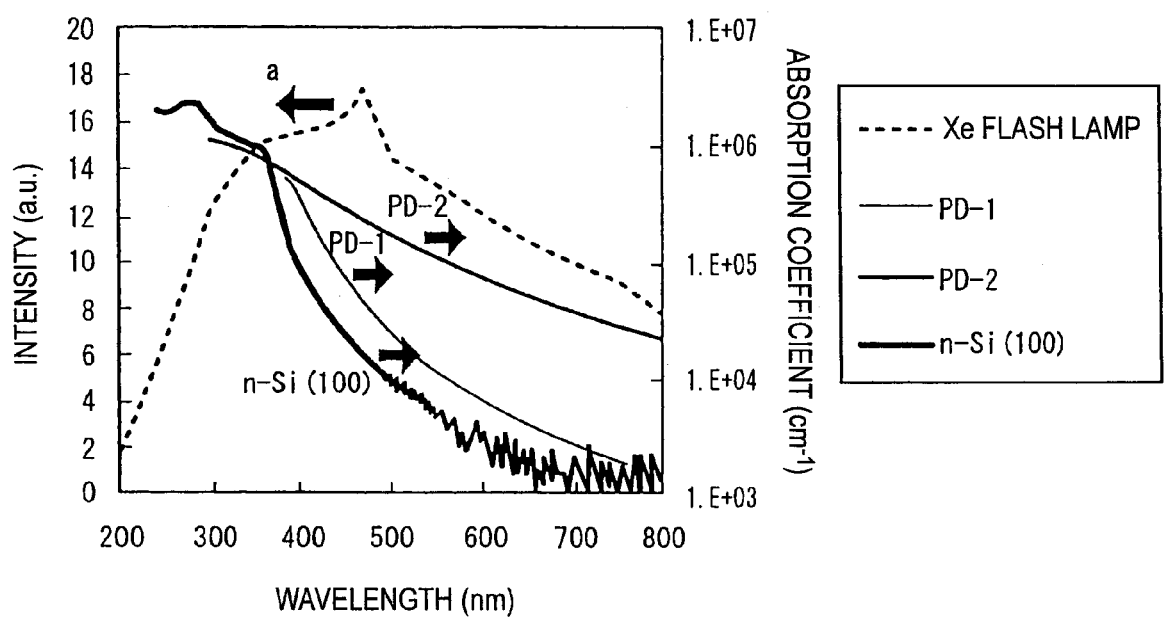
FIG. 3 is a graph showing exemplary combinations of the optical property of a doped layer and a light intensity distribution according to an example of this invention.

FIG. 3 shows a light intensity distribution of applied light and a distribution of the light absorption coefficient of the substrate according to an example of this embodiment. The applied light is xenon flash light. The xenon flash light has an intensity peak at the wavelength in the vicinity of 470 nm as indicated by curve a. Now, the light is illustrated as the light having the intensity peak at the wavelength ranging from 375 nm to 800 nm.

In FIG. 3, the curve indicated by PD-1 exhibits the absorption coefficient of the light after the n-Si(100) substrate has been plasma-doped with boron. The introduction of boron in PD-1 was carried out by plasma-doping so that the n-Si(100) substrate was irradiated with the plasma containing boron-diluted with He. The doping time was 60 sec. The same result was obtained by the doping for 7 sec or 30 sec. As regards the light absorption coefficient of the boron introduced layer in PD-1, assuming that the wavelength is $\lambda$ (nm) and the absorption coefficient is $\alpha$ (cm$^{-1}$), at the wavelength ranging from 375 nm (inclusive) to 500 nm, $\alpha > 1E38\lambda^{-12.505}$; at the wavelength ranging from 500 nm (inclusive) to 600 nm, $\alpha > 1E24\lambda^{-7.2684}$; at the wavelength ranging from 600 nm (inclusive) to 700 nm, $\alpha > 2E19\lambda^{-5.5873}$; and at the wavelength ranging from 700 nm (inclusive) to 800 nm, $\alpha > 1E17^{-4.7782}$. As seen from FIG. 3, it can be understood that PD-1 after the plasma doping has been performed exhibits a higher light absorption coefficient for the xenon flash lamp light than the n-Si(100) substrate.

The curve indicated by PD-2 in FIG. 3 exhibits the light absorption coefficient when the plasma doping was performed under a condition different from in PD-1. The doping time was 30 sec. PD-2 exhibited a higher light absorption coefficient than the n-Si(100) substrate and PD-1.

Figure 4:
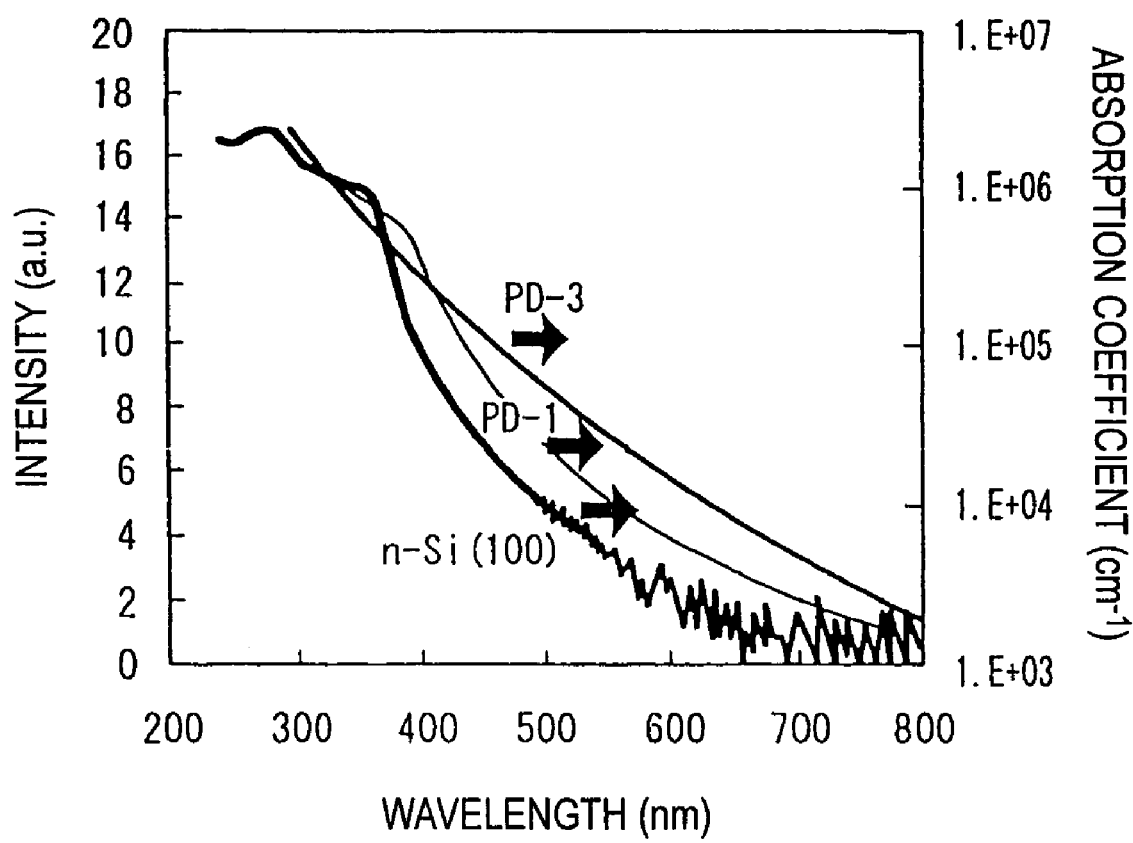
FIG. 4 is a graph showing each of the doped layers according to an example of this invention and a comparative example.

FIG. 4 shows the distribution of the light absorption coefficient of the substrate according to an example of the embodiment of this invention when the light to be applied is laser light. Where the applied light has a single wavelength like the laser light, as compared with the light having the intensity distribution for the wavelength, it is required to set a larger difference in the light absorption coefficient between the doped layer and the n-Si(100). PD-3 exhibits the curve of the light absorption coefficient of the doped layer which was formed to be adapted to the laser at the wavelength of 500 to 550 nm by adjusting the doping condition. Where the absorption coefficient is smaller than this curve, boron was diffused deeply after laser annealing. Namely, only if the light absorption coefficient of the boron introduced layer for the light from 375 nm (inclusive) to 800 nm (inclusive) is $\alpha > 1E24\lambda^{-7.1693}$, boron could be electrically activated without changing the depth distribution of boron. This may be attributable to the fact that where the absorption coefficient is smaller than the curve by PD-3 in FIG. 3, the laser energy cannot be sufficiently absorbed by the surface doped layer so that the rate of the energy absorption in the silicon substrate below the doped layer is high.

Now referring to Table 1, the diffusion depth of boron in examples will be explained. It is assumed that the diffusion depth is represented by the depth that provides the boron concentration of 1E18 cm$^{-3}$ and denoted by Xj. The difference between Xj after doping and Xj after light application is denoted by $\Delta$Xj. Example A represents a combination of the steps of plasma doping of PD-1 and application of the light having an intensity peak at the wavelength ranging from 375 nm (inclusive) to 800 nm (inclusive) and an intensity distribution for the wavelength. In this case, $\Delta$Xj ranges from several nm to 4 nm (inclusive). Assuming that the average value of $\Delta$Xj at this time is 1, $\Delta$Xj of the other samples are normalized. Example B represents a combination of plasma doping of PD-3 and application of the laser light at the wavelength ranging from 375 nm (inclusive) to 800 nm (inclusive). In this case, $\Delta$Xj is similar to that in Example A, and the $\Delta$Xj ratio is 0.9.

TABLE 1

|  | Example A | Example B | Comparative Example |
| --- | --- | --- | --- |
| $\Delta$Xj Ratio | 1.0 | 0.9 | 10 |

As described above, by performing the plasma doping, the doped layer having a higher light a sorption coefficient than n-Si(100) can be easily formed by a single step. In addition, by appropriately selecting the optical property of the doped layer and applied light, boron can be electrically activated without generally changing Xj, thereby making a shallow junction with high performance. In this case, by the condition of the plasma doping, the optical property of the doped layer can be easily adjusted.

Next, a comparative example will be explained.

Referring to Table 1, an explanation will be given of the difference in the diffusion depth between the examples according to this invention and the comparative example. A sample in which the light absorption coefficient of the doped layer after boron has been introduced by plasma doping is PD-1 was irradiated with the laser having an intensity peak at the wavelength ranging from 375 nm (inclusive) to 800 nm (inclusive). Namely, the comparative example is an combination of the plasma doping in PD-1 and the laser having an intensity peak at the wavelength ranging from 375 nm (inclusive) to 800 nm (inclusive). In the sample subjected to the plasma doping by PD-1, the light energy absorbed by the PD (plasma-doped) layer is smaller by about one order of magnitude than in the sample by PD-2. Thus, the substrate deeper than the PD layer, now, e.g. n-Si(100) absorbs a higher rate of light. Since the light absorption coefficient of n-Si(100) is small, the light energy reaches a deep range. Namely, boron diffuses deeply. In comparison of $\Delta Xj$, example A is 1 whereas the comparative example is 10 or so. Namely, in the comparative example, boron diffuses deeply by one order of magnitude than in the examples, and so apparently the shallow junction that is a target cannot be formed.

Additionally, in the embodiment described above, the explanation was given of the method for making a shallow-pn junction by forming the boron diffused layer in the n-Si(100) substrate. However, the substrate should not be limited to the n-Si(100), but may be a substrate inclined by several degrees. Further, it is needless to say that the conduction type of the impurities may be changed. Furthermore, with a suppressed temperature rise, the junction may be formed in compound semiconductor also. Accordingly, the pn junction with a reduced change in the junction level and with high reliability can be made.

This invention has been explained in detail and with reference to the specific embodiment. However, it is apparent to those skilled in the art that this invention can be realized in various changes and modifications without departing from the sprit and scope of this invention.

This application is based on Japanese Patent Application No. 2003-350368 filed in Oct. 9, 2003, and the contents thereof is incorporated herein by reference.

Industrial Applicability

As understood from the description hitherto made, in accordance with this invention, after the suitable state of a substrate surface adapted to the wavelength of an applied electromagnetic wave has been formed, the electromagnetic wave is applied to electrically activate impurities. For this reason, the process is simple, the throughput is high and the shallow junction can be easily formed. The method according to this invention is effectively employed to fabricate a miniaturized semiconductor integrated circuit.

The invention claimed is:

1. A method for forming a shallow junction comprising the steps of:
   forming an amorphous layer at a shallow region in a silicon substrate by irradiating a plasma containing He; and
   introducing an impurity by applying a plasma to the shallow region of the silicon substrate; and
   applying light having an intensity peak at a wavelength of 375nm or longer on the silicon substrate so that said shallow region is excited selectively and the shallow junction is formed electrically activated with the impurity.

2. The method for forming a shallow junction according to claim 1, wherein the plasma consists of He.

3. The method for forming a shallow junction according to claim 1, wherein, assuming that wavelength is $\lambda$(nm) and light absorption ratio is A(%), the light absorption rate of a layer which is formed by introducing the impurity into the substrate satisfies at least one of following conditions:
   at the wavelength ranging from 375 nm (inclusive) to 500 nm, $A>7E32\lambda^{-12.316}$;
   at the wavelength ranging from 500 nm (inclusive) to 600 nm, $A>2E19\lambda^{-7.278}$;
   at the wavelength ranging from 600 nm (inclusive) to 700 nm, $A>4E14\lambda^{-5.5849}$; and
   at the wavelength ranging from 700 nm (inclusive) to 800 nm, $A>2E12\lambda^{-4.773}$.

4. The method for forming a shallow junction according to claim 1, wherein, assuming that wavelength is $\lambda$(nm) and absorption coefficient is $\alpha$ (cm$^{-1}$), the light absorption coefficient of a layer which is formed by introducing the impurity into the substrate satisfies at least one of following conditions:
   at the wavelength ranging from 375 nm (inclusive) to 500 nm, $\alpha>1E38\lambda^{-12.505}$;
   at the wavelength ranging from 500 nm (inclusive) to 600 nm, $\alpha>1E24\lambda^{-7.2684}$;
   at the wavelength ranging from 600 nm (inclusive) to 700 nm, $\alpha>2E19\lambda^{-5.5873}$; and
   at the wavelength ranging from 700 nm (inclusive) to 800 nm, $\alpha>1E17\lambda^{-4.7782}$.

5. The method for forming a shallow junction according to claim 1, wherein the step of applying light is a step of irradiating light having an intensity peak at wavelength longer than 375 nm (inclusive) and shorter than 800 nm (inclusive).

6. The method for forming a shallow junction according to claim 5, wherein the light having the intensity peak at the wavelength longer than 375 nm (inclusive) and shorter than 800 nm (inclusive) is a xenon flash lamp light.

7. The method for forming a shallow junction according to claim 1, wherein the silicon substrate is a substrate having a (100) plane or the silicon substrate comprises a plane inclined from the (100) plane by several degrees.

8. The method for forming a shallow junction according to claim 1, wherein, assuming that wavelength is $\lambda$(nm) and absorption ratio is A (%), the light absorption ratio of a layer into which the impurity is introduced for light having a wavelengths longer than 375 nm (inclusive) and shorter than 800 nm (inclusive) satisfies $A>1E19\lambda^{-6.833}$.

9. The method for forming a shallow junction according to claim 1, wherein, assuming that wavelength is $\lambda$(nm) and absorption coefficient is $\alpha$ (cm$^{-1}$), the light absorption coefficient of a layer into which the impurity is introduced to light having wavelengths longer than 375 nm (inclusive) and shorter than 800 nm (inclusive) satisfies $\alpha>1E19\lambda^{-7.1693}$.

10. The method for forming a shallow junction according to claim 1, wherein the step of introducing the impurity is a step of introducing the impurity by plasma doping.

11. The method for forming a shallow junction according to claim 1, wherein the substrate is a SOI substrate with a Silicon thin film formed on a surface thereof.

12. The method for forming a shallow junction according to claim 1, wherein the substrate is a strained Si substrate with a Si film formed on a surface thereof.

13. The method for forming a shallow junction according to claim 1, wherein the substrate is a glass substrate with a poly-Si thin film formed on a surface thereof.

14. A processed material formed by the method for forming a shallow junction according to claim 1.

15. The method for forming a shallow junction according to claim 1, wherein the impurity includes boron.

16. The method for forming a shallow junction according to claim 1, wherein the substrate includes a single crystalline silicon substrate.

17. The method for forming a shallow junction according to claim 1, wherein an electric potential difference between the plasma and the semiconductor substrate surface is set to a value within the range of about 20-200V.

* * * * *